United States Patent
Pfaffinger et al.

(10) Patent No.: US 10,743,449 B2
(45) Date of Patent: Aug. 11, 2020

(54) METHOD AND SYSTEM FOR POPULATING PRINTED CIRCUIT BOARDS AND COMPUTER PROGRAM PRODUCT FOR CARRYING OUT THE METHOD

(71) Applicant: Siemens Aktiengesellschaft, München (DE)

(72) Inventors: Alexander Pfaffinger, München (DE); Christian Royer, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 244 days.

(21) Appl. No.: 15/534,010

(22) PCT Filed: Nov. 12, 2015

(86) PCT No.: PCT/EP2015/076381
§ 371 (c)(1),
(2) Date: Jun. 8, 2017

(87) PCT Pub. No.: WO2016/091527
PCT Pub. Date: Jun. 16, 2016

(65) Prior Publication Data
US 2018/0324991 A1    Nov. 8, 2018

(30) Foreign Application Priority Data
Dec. 12, 2014   (DE) .................. 10 2014 225 713

(51) Int. Cl.
*H05K 13/08* (2006.01)
*G05B 19/418* (2006.01)
*H05K 13/04* (2006.01)

(52) U.S. Cl.
CPC ..... *H05K 13/085* (2018.08); *G05B 19/41805* (2013.01); *H05K 13/0452* (2013.01);
(Continued)

(58) Field of Classification Search
None
See application file for complete search history.

(56) References Cited

U.S. PATENT DOCUMENTS 5,170,554 A     12/1992  Davis et al.
5,258,915 A *   11/1993  Billington .............. G06Q 10/04
                                                   700/103

(Continued)

FOREIGN PATENT DOCUMENTS

DE     102009013353 B3    10/2010
DE     102012220904 A1     5/2014

(Continued)

OTHER PUBLICATIONS

International Search Report for PCT/EP2015/076381; 2 pgs.
Indian Office Action dated Mar. 20, 2020 for Application No. 201717019267.

*Primary Examiner* — Ziaul Karim
(74) *Attorney, Agent, or Firm* — Schmeiser, Olsen & Watts LLP

(57) ABSTRACT

Set-up families with associated set-ups are provided for populating printed circuit boards by means of a pick-and-place line. Printed circuit board types are associated with each set-up family and component types are associated with each set-up, such that a printed circuit board of a printed circuit board type in a set-up family is populated on the pick-and-place line by means of components of the component types associated with the set-up. Stocks of components of the component types of a set-up are provided by means of set-up tables on the pick-and-place line. A method for populating the printed circuit boards includes the steps of detecting printed circuit board types of which printed circuit boards are intended to be populated with components of associated component types, of associating detected printed circuit board types with a predetermined number of set-up (Continued)

families, and of optimizing the association operation with respect to a predetermined criterion.

7 Claims, 2 Drawing Sheets

(52) U.S. Cl.
CPC ....... *H05K 13/087* (2018.08); *H05K 13/0882* (2018.08); *G05B 2219/45026* (2013.01)

(56) References Cited

U.S. PATENT DOCUMENTS

| | | | |
|---|---|---|---|
| 2004/0073322 A1* | 4/2004 | Maenishi | H05K 13/0452 700/28 |
| 2004/0153868 A1* | 8/2004 | Nonaka | G05B 19/41805 714/47.2 |
| 2005/0065620 A1* | 3/2005 | Maenishi | H05K 13/0452 700/28 |
| 2005/0284743 A1 | 12/2005 | Takiguchi | |
| 2012/0004762 A1 | 1/2012 | Bauer | |

FOREIGN PATENT DOCUMENTS

| | | |
|---|---|---|
| EP | 0478360 A1 | 4/1992 |
| JP | H04246897 A | 9/1992 |
| JP | 2006012946 A | 1/2006 |
| JP | 2006171916 A | 6/2006 |
| JP | 2009071137 A | 4/2009 |
| JP | 2012520577 A | 9/2012 |
| WO | WO 2014005744 A1 | 1/2014 |
| WO | 2014079600 A1 | 5/2014 |

\* cited by examiner

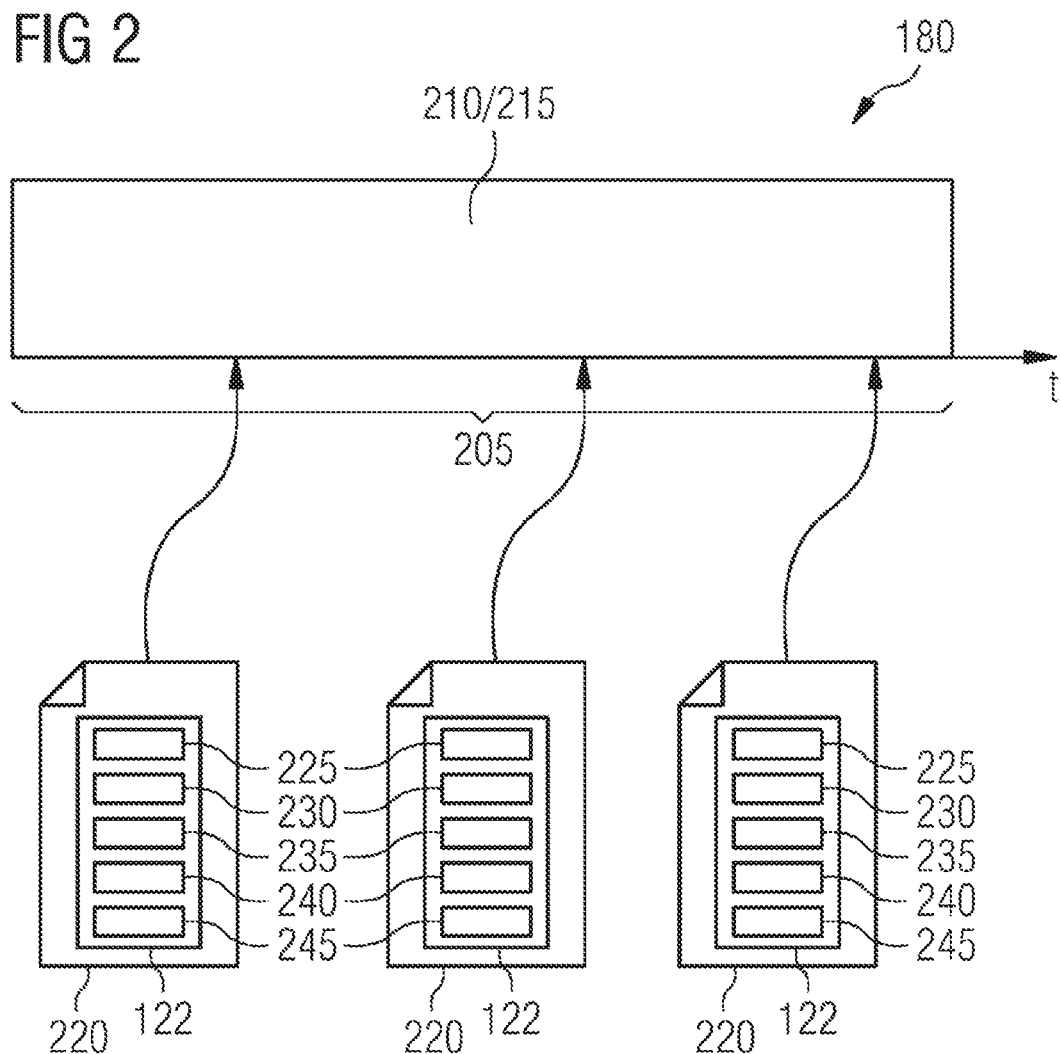
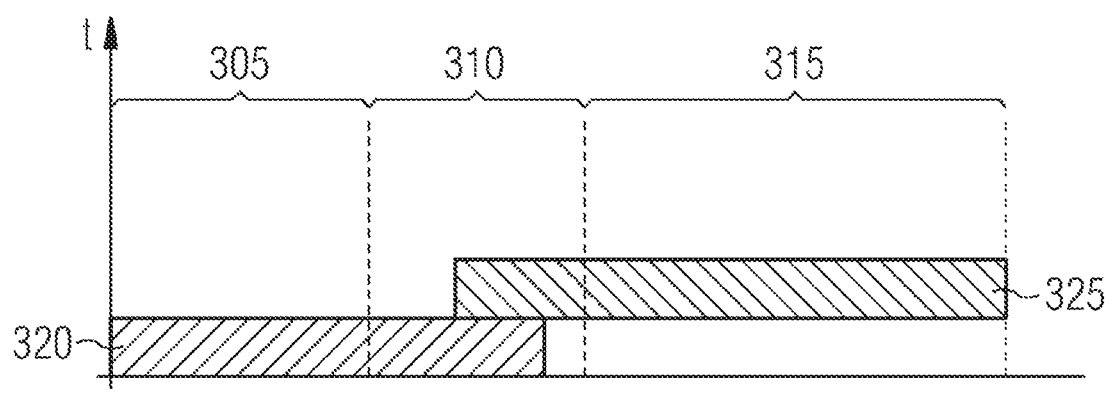

METHOD AND SYSTEM FOR POPULATING PRINTED CIRCUIT BOARDS AND COMPUTER PROGRAM PRODUCT FOR CARRYING OUT THE METHOD

CROSS-REFERENCE TO RELATED APPLICATIONS

This application claims priority to PCT Application No. PCT/EP2015/076381, having a filing date of Nov. 12, 2015, which is based upon and claims priority to DE Application No. 10 2014 225 713.1, having a filing date of Dec. 12, 2014 the entire contents both of which are hereby incorporated by reference.

FIELD OF TECHNOLOGY

The following relates to a method and a system for populating printed circuit boards, which presupposes a pick-and-place line which is set up to populate printed circuit boards with components.

BACKGROUND

An electronic assembly comprises a printed circuit board and components which are mechanically and electrically fastened on the latter. In order to produce the printed circuit board, the components are placed on the printed circuit board by means of a pick-and-place machine and are then soldered to the printed circuit board in a reflow oven. A plurality of pick-and-place machines can be run through in succession on a pick-and-place line. In order to produce a large number of printed circuit boards, it is possible to use a pick-and-place system which comprises a plurality of pick-and-place lines.

A composition of component types on the pick-and-place machine is called a set-up. A set-up makes it possible to produce a set of different printed circuit boards which is called a set-up family. However, the intention is usually to produce printed circuit boards of more different printed circuit board types than is possible by means of one set-up, with the result that the set-up has to be changed during production.

A set-up can be held on one or more set-up tables which can be easily exchanged on the pick-and-place machine. However, it is complicated to set up a set-up table with components of predetermined component types. The set-ups are therefore often distinguished as fixed set-ups and variant set-ups, in which case a fixed set-up table is intended to retain its composition of component types over a predetermined planning horizon, whereas a variant set-up table is presumably modified within the planning horizon.

DE 10 2012 220 904 A1 relates to a method for determining a fixed set-up which is as advantageous as possible for a pick-and-place line.

If a plurality of set-ups are used in succession on a pick-and-place line, it is possible to form a constant set-up table which remains on the pick-and-place line in the event of a set-up change and whose composition of component types is also not changed in this case. DE 10 2009 013 353 shows a method for finding set-ups or set-up families while forming constant set-up tables.

If only constant set-up tables are formed, only sub-optimum or, under certain circumstances, even only very poor fixed set-ups can be formed and can be used only very rarely. If, in contrast, fixed set-ups are formed first and their component types are then assigned on set-up tables, only very few or no constant set-up tables at all can usually be formed.

SUMMARY

An aspect relates to an improved method, a computer program product and a system for populating printed circuit boards, allowing more efficient population of a pick-and-place line.

In order to populate printed circuit boards by means of a pick-and-place line, set-up families with associated set-ups are provided. A number of printed circuit board types is assigned to each set-up family and a number of component types is assigned to each associated set-up, with the result that a printed circuit board of a printed circuit board type in a set-up family can be populated by means of components of the component types in the set-up on the pick-and-place line. Stocks of components of the component types in a set-up can be provided by means of set-up tables on the pick-and-place line. A method for populating the printed circuit boards comprises steps of detecting printed circuit board types, printed circuit boards of which are intended to be populated with components of associated component types, assigning detected printed circuit board types to a predetermined number of set-up families, and optimizing the assignment with respect to a predetermined criterion. In this case, the optimization is carried out in such a manner that the component types in the set-ups of all set-up families can be divided among set-up tables such that at least one constant set-up table can remain on the pick-and-place line over all set-ups. One of the set-ups can then be provided on the pick-and-place line, and printed circuit boards of a printed circuit board type assigned to the set-up family of the set-up can be populated on the pick-and-place line.

This makes it possible to handle different target criteria at the same time, namely the optimization of a population volume or an order number and the formation of one or more constant set-up tables, for example. One-sided optimization of only one of the target criteria can thereby be avoided, with the result that the overall result can be improved. The pick-and-place line can thereby be operated with improved efficiency and costs of operating it can be reduced.

Each printed circuit board type can be assigned an order number which indicates how many population orders are present for the printed circuit board type in a predetermined planning horizon. In this case, the criterion may comprise maximizing the sum of the order numbers as far as possible. Each population order may be assigned a quantity of printed circuit boards of the printed circuit board type.

This makes it possible to track an efficient target criterion, while the constant set-up table is formed at the same time.

A quantity of printed circuit boards to be populated can be assigned to each printed circuit board type, the criterion comprising maximizing the sum of the quantities, which can be populated by means of all set-ups on the pick-and-place line, as far as possible.

In another embodiment, a quantity of printed circuit boards to be populated and a population time which is needed to populate a printed circuit board of the printed circuit board type on the pick-and-place line are assigned to each printed circuit board type. In this case, the criterion comprises maximizing the population time, which is needed to populate all printed circuit boards of all printed circuit board types, as far as possible.

The optimization can be carried out in such a manner that a predefined number of a plurality of constant set-up tables can remain on the pick-and-place line over all set-ups.

The component types in the fixed set-ups preferably remain unchanged within a predetermined planning horizon. The method can therefore ensure that the printed circuit board types are divided into the fixed set-up families and a variable set-up portion. The predetermined planning horizon may be in the region of months, for example approximately 6 to 12 months. Printed circuit board types which are not assigned to a fixed set-up family can be handled by means of a further method. For this purpose, they can be temporarily assigned, for example, to a variable set-up family which can be formed from the variable set-up portion.

It is particularly preferred for the assignment to be carried out by means of mixed integer programming. Mixed integer programming is a global optimization approach which can be easily extended and for which commercial solution methods or solution apparatuses are available. Mixed integer programming can be used to find global maxima in a multiplicity of possible solutions, with the result that particularly good optimization can be found. Available methods or apparatuses for mixed integer programming are being continuously improved, with the result that it can be expected that even better optimization results will be able to be achieved in future.

In mixed integer programming, it is advantageously respectively known for a particular assignment how high the assignment quality is in comparison with a maximum achievable assignment quality. A difference between these two characteristic numbers is also called a "gap". As a result, it is preferably possible to abort the optimization when a predetermined assignment quality has been reached or when the gap is sufficiently small. Alternatively or additionally, the optimization can be aborted when an assignment whose assignment quality satisfies the predefined criteria cannot be found during a predetermined processing time. As a result, it is possible to prevent an assignment quality which is selected to be too high or a gap which is selected to be too small from preventing the determination of an assignment in an appropriate time.

In another embodiment, the method also comprises the step of dividing the component types in the fixed set-ups among the set-up tables and the at least one constant set-up table in such a manner that the at least one constant set-up table can remain on the pick-and-place line over all fixed set-ups. In other words, a constant set-up table differs from a normal set-up table in that it remains fitted to the pick-and-place line without change in the event of a set-up change, in particular from one fixed set-up to another fixed set-up.

Instead of only one constant set-up table, it is also possible to form a plurality of constant set-up tables. In one preferred embodiment of the method, the optimization is carried out in such a manner that the component types in the fixed set-ups can be divided among set-up tables in such a manner that a predetermined number of constant set-up tables can remain on the pick-and-place line over all fixed set-ups. The predetermined number can preferably be predefined for the optimization.

An important practical production parameter can therefore be used for the optimization.

In one embodiment of the method, exactly two fixed set-ups are provided. By means of appropriate formulation of boundary conditions for example, the optimization can be significantly accelerated by this restriction. In practice, a configuration having exactly two fixed set-ups can often be encountered.

It is also preferred for the assignment to be carried out in such a manner that a space used by the component types, which are assigned to a pick-and-place line within the scope of the particular set-up, complies with a predetermined portion of an available space. This space is usually expressed in tracks, a track being able to have a width of 8 mm, for example. A set-up table comprises 40 tracks, for example, and a pick-and-place machine provides space for two set-up tables. In this example, the total available space is 640 mm, in which case the boundaries of the set-up tables have to be taken into account. It may be required, for example, for the determined set-up to occupy no more than approximately 90% of this space in order to have the flexibility to be able to accommodate additional component types for rush orders in the set-up.

A computer program product comprises program code means for carrying out the described method when it runs on a processing device or is stored on a computer-readable medium. The processing device may comprise a programmable microcomputer, in particular.

A system for populating printed circuit boards comprises a pick-and-place line and a processing device for carrying out the method stated above.

BRIEF DESCRIPTION

Some of the embodiments will be described in detail, with reference to the following figures, wherein like designations denote like members, wherein:

FIG. 2 shows an illustration of set-up families on a pick-and-place line from FIG. 1, in accordance with embodiments of the present invention; and FIG. 3 shows set-ups on a pick-and-place machine, in accordance with embodiments of the present invention.

DETAILED DESCRIPTION

Figure 1:
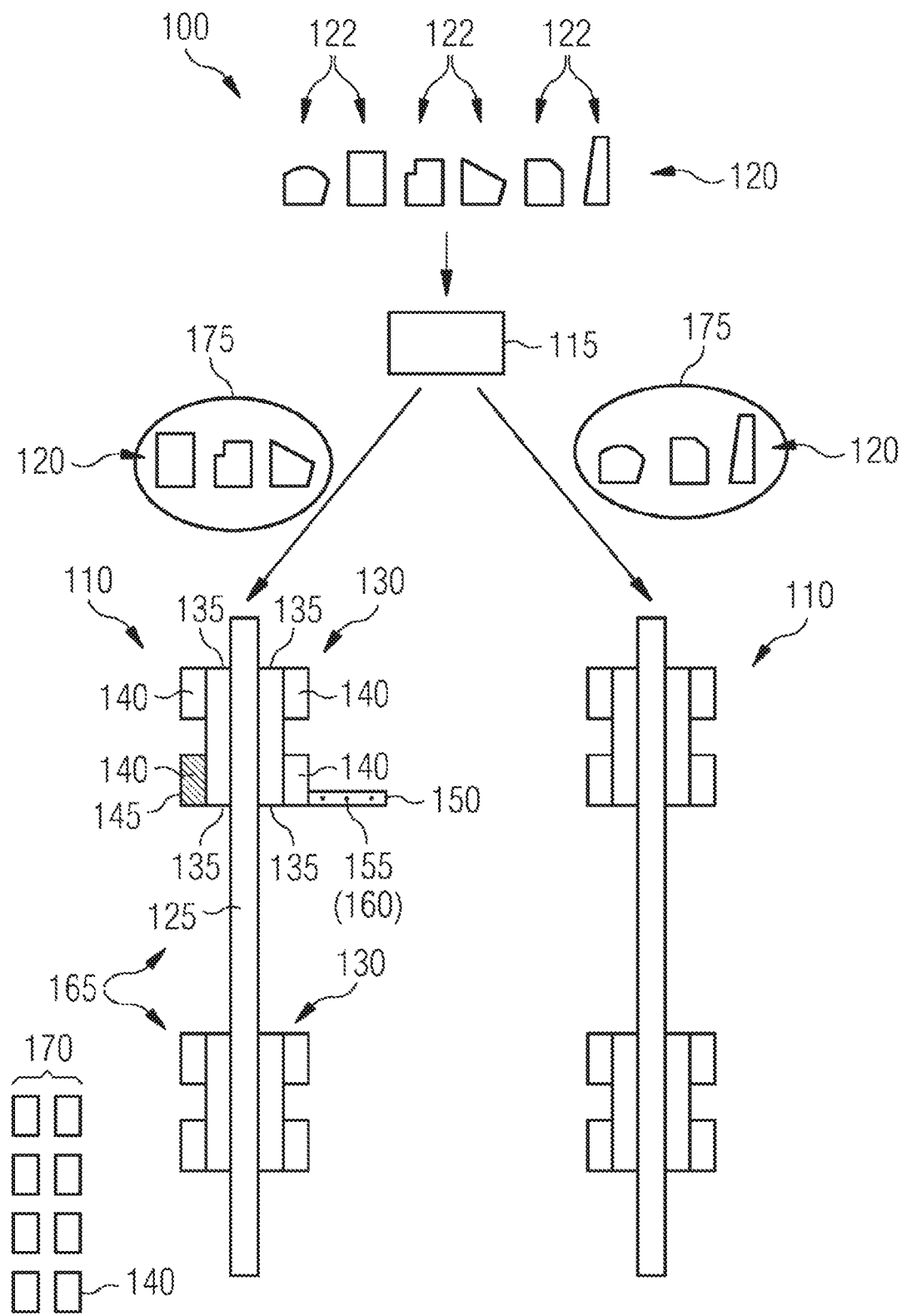
FIG. 1 shows a pick-and-place system, in accordance with embodiments of the present invention.

FIG. 1 shows an exemplary pick-and-place system 100. The pick-and-place system 100 comprises one or more pick-and-place lines 110 and a processing or control device 115. Each pick-and-place line 110 comprises an optional transport system 125 and one or more pick-and-place machines 130. Each pick-and-place machine 130 comprises one or more pick-and-place heads 135 which are each set up to pick up components 155 from a set-up table 140 and to position them at a predetermined position on the printed circuit board 120 which is situated on the transport system 125. During the population operation, the printed circuit board 120 is usually stationary with respect to the pick-and-place machine 130.

The set-up tables 140 each comprise a multiplicity of supply devices 150, of which only one is illustrated by way of example in FIG. 1. Each supply device 150 holds a stock of components 155 of a predetermined component type 160. For the components 155, the supply device 150 usually has a capacity which can be expressed in tracks. A track usually has a width of 8 mm and the number of tracks of a set-up table 140 is restricted, for example to 40. Components 155 of the same component type 160 are usually provided in a belt, on a tray or in a tube. Each component type 160 requires a predetermined number of tracks, which are usually adjacent to one another, on the supply device 150 and on the set-up table 140.

A supply device 150 can usually be configured to hold components 155 of different component types 160, and different supply devices 150 can usually be fitted to a set-up table 140. In the present case, it is assumed, for the purpose of simplification, that a stock of components 155 of a component type 160 on a supply device 150 is virtually infinite, that is to say there is no need for restocking.

If a component 155 of a component type 160, which is not present on one of the set-up tables 140, is required on the pick-and-place machine 130, the assignment of components 155 on one of the fitted set-up tables 140 is usually not changed, but rather the set-up table 140 is completely exchanged for another, appropriately furnished, set-up table 140. The operation of furnishing a set-up table 140, which is not fitted to the pick-and-place line 110, with components 155 is called preliminary setting-up and can require a processing time in the region of one or more hours, for example approximately 6-10 hours.

Since a change of set-up tables 140 on the pick-and-place line 110, a so-called set-up change, is usually associated with a production standstill, the aim is to change the set-up tables 140 as rarely as possible. Since the set-up tables 140 are also costly and the process of modifying a set-up table 140 can be complicated and lengthy, an attempt is also made to form as few set-ups as possible in order to produce a predetermined production volume of printed circuit boards 120 of predetermined printed circuit board types 122. In this case, the production volume comprises a plurality of printed circuit board types 122, a predetermined quantity of printed circuit boards 120 of which is respectively intended to be populated with components 155 of predetermined component types 160. For example, 300 printed circuit boards 120 of a first printed circuit board type 122 and 200 printed circuit boards 120 of a second printed circuit board type 122 can be populated.

A set-up 165, 170 comprises a set of component types 160 and is implemented by means of one or more set-up tables 140 which are equipped with stocks of components 155 of the component types 160 in the set-up 165, 170 and are fitted to the pick-and-place line 110.

The set-up 165, 170 is assigned a set-up family 175 which comprises printed circuit board types 122, printed circuit boards 120 of which can be populated by means of components 155 of the component types 160 in the set-up 165, 170. A set-up family 175 is assigned to precisely one set-up 165, 170 and vice versa.

In order to increase the utilization of a pick-and-place line 110 or to reduce a need for set-up tables 140, it is therefore decisive how set-up families 175 are formed on the basis of the printed circuit board types 122 to be populated. Secondary conditions need to be heeded when forming set-ups 165, 170 or set-up families 175, for example the compliance with a limited capacity of a set-up table 140 for component types 160 or a grouping of predetermined printed circuit board types 160 in the same set-up family 175, for instance for reasons of using leaded or unleaded soldering tin.

The set-ups may be distinguished as fixed set-ups 165 and variant set-ups 170, in which case a fixed set-up 165 is intended to remain set up without change on a number of shuttle tables 140 over a predetermined planning horizon, whereas a shuttle table 140 of a variant set-up 170 is presumably modified with components 155 of other component types 160 within the planning horizon. The planning horizon may be 6 to 12 months, for example. A variant set-up 165 consists of a predetermined configuration usually considerably shorter than the planning horizon, for example over several hours or days, but usually no more than a week.

The set-ups 165, 170 can be exchanged as required on the pick-and-place line 110. In order to implement a fixed set-up 165 or a variant set-up 170, a set-up table 140 is usually set up with stocks of components 155 of predetermined component types 160 while it is not fitted to the pick-and-place line 110. Components 155 which have already been set up of component types 160 which are not required can be dismantled beforehand. This modification may comprise a considerable portion of manual work and may be time-consuming.

In order to minimize the effort associated with a variant set-up 170, an attempt is made to accommodate as many printed circuit board types 122 as possible in the fixed set-ups 165. However, a desired case without variant set-ups 170 can scarcely be achieved in practice.

It may be advantageous to form a constant set-up table 145 which is used in different set-ups 165, 170, with the result that it can remain set up without change on the pick-and-place line 115 in the event of a set-up change. In other words, a constant set-up table 145 differs from a non-constant set-up table 140 in that it remains unchanged in the event of a set-up change from one set-up 165, 170 to another set-up 165, 170. Instead of a conventional movable set-up table 140, a more cost-effective immovable set-up table can be used as a constant set-up table 145. A constant set-up table 145 usually comprises components 155 of component types 160 which are very widespread on the printed circuit board types 122 to be populated, for example 100 nF capacitors or 0Ω resistors.

As part of the control of the pick-and-place system 100, the control device 115 respectively assigns printed circuit board types 122, the associated printed circuit boards 120 of which are intended to be populated on the pick-and-place line 110, to a set-up family 175, in which case it is possible to form fixed set-up families 175, which are each assigned to a fixed set-up 165, and variant set-up families 175, which are each assigned to a variant set-up 170. The aim is to form the set-up families 175 in such a manner that the associated set-ups 165, 170 can be implemented such that components 155 of as many component types 160 as possible can be held on one or more constant set-up tables 145. This procedure is advantageous during variant production, in particular, in which a fixed set-up 165 cannot be used.

In practice, for a predefined production volume of printed circuit board types 122 for example, a fixed set-up 165 can be formed for a part (which is as large as possible) of the printed circuit board types 122 in a first step, after which variant set-ups 170 are formed for the remaining part of the printed circuit board types 122 in a second step such that they can be implemented by means of one or more constant set-up tables 145 which accommodate components 155 of as many component types 160 as possible. The two steps can also be carried out concurrently or in an integrated manner. The quality of the optimization of these assignments greatly decides how well the production means of the pick-and-place system 100 can be utilized and how efficiently the circuit boards can be populated in this case.

FIG. 2 shows an illustration of exemplary set-up families 175 on a pick-and-place line 110 from FIG. 1. In this case, the set-up families 175 are distinguished as a fixed set-up family 210, which is assigned to a fixed set-up 165, and a variant production set-up family 215, which is assigned to a variant set-up 170. Within a planning horizon 205, printed circuit board types 122 in a single fixed set-up family 210 or in a single variant production set-up family 215 can be populated on the pick-and-place line 110 in the example illustrated.

It is assumed that, at the beginning of the planning horizon 205, there are a plurality of orders 220 which need to be executed as efficiently as possible. The number of orders is called the order number. Each order 220 comprises at least one printed circuit board type 122 and a quantity 225 of printed circuit boards 120 to be populated. The printed circuit board type 122 is assigned component types 160, components 155 of which are to be populated on the individual printed circuit boards 120.

A printed circuit board type 122 may be assigned further information. For example, a number 230 of component types 160 which are intended to be populated on each printed circuit board 120, a number 235 of populating positions of a printed circuit board 120 or a production time 240 for a printed circuit board 120 of the respective printed circuit board type 122 may be stated. The number of populating positions corresponds to the number of components 155 to be populated on a printed circuit board 120 of the printed circuit board type 122, irrespective of the component type 160. It is also possible to state an order number 245 which indicates how many orders 220 for populating printed circuit boards 120 of a printed circuit board type 122 are present in a predetermined planning horizon 205.

The use of mathematical methods makes it possible to achieve considerably better solutions for the assignment of printed circuit board types 122 to set-up families 175 than with procedures previously used in practice. In order to determine an optimized assignment of printed circuit board types 122 to a fixed set-up family 210, it is also possible to use automatic optimization which can start from an initial assignment.

Different methods can be used for the optimization, for example on the basis of local search methods or meta-heuristic algorithms. However, an IP model (integer programming or integer program or mixed integer optimization model) is preferably used. One of the main methods in the field of mathematical optimization is linear optimization which deals with optimizing linear target functions over a set which is restricted by linear equations and inequations. Linear optimization is the basis of the solution methods of (mixed) integer linear optimization.

Advantages of linear optimization:
Global optimization approach
Easily extendable
Very good commercial standard solvers (Ilog, Gurobi, Xpress) which are widespread and tried and tested in practice
For a determined solution, it is known how far away it is at most from the optimum solution (gap).

Examples of IP formulations for optimizing the described assignment of printed circuit board types 122 to set-up families 175 are given below.

Indices
C Set of the component types
R Set of the printed circuit board types
Rc Set of the printed circuit board types with component type c
F Set of the set-up families Parameters
$Width_c$ Space used (in tracks) by a component type c
CapVar Capacity (in tracks) of the non-constant set-up tables 140
CapConst Capacity (in tracks) of the constant set-up tables 145

$Order_r$ Number of orders for printed circuit boards of the printed circuit board type r Binary Variables
$ASSign_{r,f}$ has the value 1 if a printed circuit board type r is assigned to the fixed set-up family f, otherwise has the value 0.
$Setup_{c,f}$ has the value 1 if the component type c must be set up in the set-up of the fixed set-up family f, otherwise has the value 0.
$SetupFixed_c$ has the value 1 if the component type c has to be set up in at least one fixed set-up 165, otherwise has the value 0.
$SetupConst_c$ has the value 1 if the component type c has to be set up on a constant set-up table 140, otherwise has the value 0.
$SetupVar_{c,f}$ has the value 1 if the component type c has to be set up in the set-up of the fixed set-up family f on the non-constant set-up tables 140, otherwise has the value 0.

IP Formulation

The optimization can be carried out with respect to the quantity 225 of orders 220 for populating printed circuit boards 120 of particular printed circuit board types 122. Therefore, an attempt can be made to find fixed set-ups 165 which can be used to populate as many printed circuit boards 120 as possible.

It is proposed to carry out the assignment or its optimization in such a manner that it is ensured that at least one constant set-up table 145 can be formed. In this case, it is also preferred for the constant set-up table 145 to be included in one or more fixed set-ups 165, preferably in all fixed set-ups. The number of constant set-up tables 145 which are intended to be formed can preferably be predefined.

The following phrasing relates to an MIP (mixed integer linear program) which can be executed, for example, by means of a standard solver:

$$\text{maximize} \sum_{r \in R} \sum_{f \in F} Order_r Assign_{r,f}$$

In the case of optimization by means of MIP, it is possible to predefine one or more boundary conditions which can guarantee the formation of the constant set-up tables 140:

$$\sum_{f \in F} Assign_{r,f} \leq 1 \qquad r \in R \qquad (1)$$

$$\sum_{r \in R_c} Assign_{r,f} \leq |R_c| Setup_{c,f} \qquad c \in C; f \in F \qquad (2)$$

$$Setup_{c,f} \leq SetupConst_c + SetupVar_{c,f} \quad c \in C; f \in F \qquad (3)$$

$$\sum_{c \in C} Width_c SetupVar_{c,f} \leq CapVar \qquad f \in F \qquad (4)$$

$$\sum_{c \in C} Width_c SetupConst_c \leq CapConst \qquad (5)$$

$$Setup_{c,f} \in \{0, 1\} \qquad c \in C; f \in F$$

$$SetupConst_c \in \{0, 1\} \qquad c \in C$$

$$SetupVar_{c,f} \in \{0, 1\} \qquad c \in C, f \in F$$

$$Assign_{r,f} \in \{0, 1\} \qquad r \in R; f \in F$$

The following explanations apply to these conditions:

Re (1): Each printed circuit board type 122 can be allocated to at most one fixed set-up 165.

Re (2): A component type 160 must be held in a fixed set-up f if at least one printed circuit board type 122, to which this component type 160 is allocated, is allocated to this fixed set-up 165.

Re (3): If a component type 160 is in a fixed set-up 165, it must be either on the constant set-up tables 145 or on the non-constant set-up tables 140 of the set-up.

Re (4): The capacities of the non-constant set-up tables 140 of a fixed set-up 165 must be complied with.

Re (5): The capacities of the constant set-up tables 145 must be complied with.

In a special situation which can often be encountered in practice, two fixed set-up families 210 are provided. A fixed set-up 165, 170 is bijectively assigned to each set-up family 175. In this case, the optimization can be carried out considerably more quickly with the boundary conditions stated below than with the general formulation of the optimization problem stated above. This makes it possible to achieve a speed advantage in the region of a factor of approximately 10:

$$\text{maximize} \sum_{r \in R} \sum_{f \in F} Order_r Assign_{r,f}$$

The boundary conditions are:

$$\sum_{f \in F} Assign_{r,f} \leq 1 \qquad r \in R \qquad (1)$$

$$\sum_{r \in R_c} Assign_{r,f} \leq |R_c| Setup_{c,f} \qquad c \in C; f \in F \qquad (2)$$

$$\sum_{c \in C} Width_c Setup_{c,f} \leq CapVar + CapConst \qquad f \in F \qquad (3)$$

$$\sum_{f \in F} Setup_{c,f} \leq 2 SetupFixed_c \qquad c \in C \qquad (4)$$

$$\sum_{f \in F} Setup_{c,f} \geq SetupFixed_c \qquad c \in C \qquad (5)$$

$$\sum_{c \in C} Width_c SetupFixed_c \leq 2 \, CapVar + CapConst \qquad (6)$$

$Setup_{c,f} \in \{0, 1\}$      $c \in C; f \in F$ $SetupFixed_c \in \{0, 1\}$      $c \in C$ $Assign_{r,f} \in \{0, 1\}$      $r \in R; f \in F$ The following explanations apply to these conditions:

Re (1): Each printed circuit board type 122 can be allocated to at most one fixed set-up 165.

Re (2): A component type 160 must be held in a fixed set-up f if at least one printed circuit board type 122, to which this component type 160 is allocated, is allocated to this fixed set-up 165.

Re (3): The spaces used by the fixed set-ups 165 must not exceed the line capacities. The line capacity of the pick-and-place line 110 indicates how much space is available for components 155 of different component types 160. The line capacity is usually expressed in tracks.

Re (4): If a component type 160 is in a fixed set-up 165, it belongs to the set of component types in the fixed set-ups 165.

Re (5): If a component type 160 is in the set of component types in the fixed set-ups 165, it is in at least one fixed set-up 165.

Re (6): The sum of the spaces used by the component types 160 in the two fixed set-ups 165 must not exceed the line capacity available for them. This corresponds to twice the line capacity of the non-constant set-up tables 140 plus the line capacity of the constant set-up tables 145 since both fixed set-ups 165 share the constant set-up tables 145.

FIG. 3 shows set-ups 165, 170 for a pick-and-place machine 130. Tracks of the pick-and-place machine 130 and of available set-up tables 140 are illustrated in the horizontal direction, and temporally successive set-ups 165, 170 are illustrated in the vertical direction. The illustration also analogously applies to a pick-and-place line 110 having a plurality of pick-and-place machines 130. The tracks are divided into three sections 305, 310 and 315, the sections 305 and 315 corresponding to the capacity of the non-constant set-up tables, and the section 310 corresponding to the capacity of the constant set-up tables 145. A first fixed set-up 320 occupies tracks from the sections 305 and 310; a second fixed set-up 325 occupies tracks from the sections 310 and 315. Component types 160 which are vertically above one another in the illustration are identical. Components 155 of the component types 160 in the central section 310 can be set up on a constant set-up table 145 which does not need to be exchanged in the transition from the first fixed set-up 320 to the second fixed set-up 325. Components 155 of the component types 160 which are in the sections 305 and 315 can be set up on different set-up tables 140. In this case, the component types 160 are disjoint, with the result that the set-up table 140 in the first section 305 can be exchanged for that in the second section 315 on the pick-and-place line 110 in the event of a set-up change from the first fixed set-up 320 to the second fixed set-up 325. This procedure can also be used with variant set-ups 170 or between a fixed set-up 160 and a variant set-up 165.

The presented method which is expressed by the exemplary MIP formulations above can be easily adapted to other targets or another target criterion to be optimized. For example, the population volume can be optimized instead of the order number. For this purpose, only $order_r$ needs to be replaced with $PopulationVolume_r$ in one of the conditions stated above.

Alternative or additional conditions can also be stated for the optimization. For example, it may be required for a subset of the printed circuit board types 122 to have to be assigned to the same set-up family 210, 215, for instance in order to respectively populate a front side and a rear side of the associated printed circuit boards 120.

After the fixed set-ups 165 have been determined and the component types 160 in the individual fixed set-ups 165 have been divided among constant set-up tables 145 and set-up tables 140, the population can be carried out with one of the set-ups 165, 170 on the pick-and-place line 110. The population process may likewise be controlled by the control device 115 or by another control device.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

The invention claimed is:

1. A method for populating printed circuit boards by means of a pick-and-place line, a plurality of set-up families including at least one fixed set-up family with at least one associated fixed set-up, a first variant family with a first associated variant set-up and a second variant family with a second associated variant set-up, a plurality of printed circuit board types being assigned to each set-up family of the plurality of set-up families, a plurality of component types being assigned to each of the at least one associated fixed set-up, first associated variant set up, and second associated variant set-up, wherein a printed circuit board of a printed circuit board type in a set-up family of the plurality of set-up families is populated by means of components of the component types in the at least one associated fixed set-up, first associated variant set up, and second associated variant set-up, and wherein stocks of components of the component types in the at least one associated fixed set-up, first associated variant set up, and second associated variant set-up are provided by means of set-up tables including at least one constant set-up table on the pick-and-place line, the method comprising:

forming the at least one fixed set-up for the at least one fixed set-up family such that the fixed set-up is not required to be changed for a predefined planning horizon;

forming a first variant set-up for the first variant family such that the first variant set-up is implemented by the at least one constant set-up table; and forming a second variant set-up for the second variant family such that the second variant set-up is implemented by the at least one constant set-up table, detecting the plurality of printed circuit board types, a plurality of printed circuit boards of which are intended to be populated with components of associated component types;

assigning the detected printed circuit board types to a predetermined number of the plurality of set-up families; and optimizing an assignment with respect to a predetermined criterion;

wherein:

each printed circuit board type is assigned an order number that indicates a quantity of population orders that are present for the printed circuit board type for populating on the pick-and-place line in a predetermined planning horizon, and the criterion comprising maximizing a sum of the order numbers as far as possible, or a quantity of the plurality of printed circuit boards to be populated being assigned to each printed circuit board type, and the criterion comprising maximizing a sum of the quantities, the plurality of printed circuit boards being populated by means of all set-ups on the pick-and-place line, as far as possible, or a quantity of the plurality of printed circuit boards to be populated and a population time needed to populate a printed circuit board of the printed circuit board type on the pick-and-place line being assigned to each printed circuit board type, and the criterion comprising maximizing the population time needed to populate all printed circuit boards of all printed circuit board types, wherein the optimization is carried out such that the component types in the set-ups of all set-up families in the plurality of set-up families are divided among the set-up tables such that the at least one constant set-up table remains unchanged on the pick-and-place line in the event of a set-up change from the first variant set-up to the second variant set-up; and the plurality of printed circuit boards of a printed circuit board type assigned to a set-up family of the plurality of set-up families are populated on the pick-and-place line.

2. The method as claimed in claim 1, wherein exactly two set-ups are provided, with the result that a set-up is bijectively assigned to each set-up family.

3. The method as claimed in claim 1, wherein the optimization is carried out by means of mixed integer programming.

4. The method as claimed in claim 1, wherein the set-up families are each assigned a fixed set-up that remains unchanged within a predetermined planning horizon.

5. The method as claimed in claim 4, further comprising dividing the plurality of component types in the associated set-ups among the set-up tables and the at least one constant set-up table in such a manner that the at least one constant set-up table can remain on the pick-and-place line over all fixed set-ups.

6. The method as claimed in claim 1, wherein the assignment is carried out in such a manner that a space used by the plurality of component types assigned to a pick-and-place line within the scope of a particular set-up, complies with a predetermined portion of an available space.

7. A system for populating printed circuit boards, comprising
a pick-and-place line; and
a processing device respectively assigning printed circuit board types, the plurality of printed circuit boards of the printed circuit board types are intended to be populated on the pick-and-place line, to a set-up family according to the method as claimed in claim 1.

* * * * *